United States Patent
Nyshadham et al.

(10) Patent No.: US 7,672,640 B2
(45) Date of Patent: Mar. 2, 2010

(54) MULTICHANNEL ABSORBERLESS NEAR FIELD MEASUREMENT SYSTEM

(75) Inventors: Adiseshu Nyshadham, Calgary (CA); Ruska Patton, Calgary (CA); Jason Jin, Calgary (CA)

(73) Assignee: EMSCAN Corporation, Calgary, Alberta (CA)

( * ) Notice: Subject to any disclaimer, the term of this patent is extended or adjusted under 35 U.S.C. 154(b) by 518 days.

(21) Appl. No.: 11/686,983

(22) Filed: Mar. 16, 2007

(65) Prior Publication Data

US 2007/0285322 A1 Dec. 13, 2007

Related U.S. Application Data

(60) Provisional application No. 60/744,316, filed on Apr. 5, 2006.

(51) Int. Cl.
*H04B 5/00* (2006.01)
(52) U.S. Cl. .................. 455/41.1; 455/279.1; 455/66.1; 455/67.15; 455/139; 342/360; 342/153; 343/703
(58) Field of Classification Search .............. 455/41.1, 455/279.1, 66.1, 67.15, 67.16, 139, 267.1; 342/360, 153, 165, 174; 343/703, 754
See application file for complete search history.

(56) References Cited

U.S. PATENT DOCUMENTS

| | | | | |
|---|---|---|---|---|
| 3,866,227 A | * | 2/1975 | Ruvin | 342/405 |
| 3,971,026 A | * | 7/1976 | Toman | 342/408 |
| 4,239,010 A | * | 12/1980 | Amburn | 342/70 |
| 4,453,164 A | * | 6/1984 | Patton | 342/360 |
| 5,019,768 A | * | 5/1991 | Criswell et al. | 322/2 R |
| 5,229,776 A | * | 7/1993 | Kelly et al. | 342/173 |
| 5,365,241 A | * | 11/1994 | Williams et al. | 343/703 |
| 5,936,588 A | * | 8/1999 | Rao et al. | 343/754 |
| 5,969,661 A | * | 10/1999 | Benjamin | 342/22 |
| 6,127,987 A | * | 10/2000 | Maruyama et al. | 343/835 |
| 6,163,726 A | * | 12/2000 | Wolf | 607/101 |
| 6,191,744 B1 | * | 2/2001 | Snow et al. | 343/703 |
| 6,208,287 B1 | | 3/2001 | Sikina et al. | |
| 6,456,235 B1 | * | 9/2002 | Utley et al. | 342/360 |
| 6,750,822 B2 | | 6/2004 | Fritzel | |
| 6,762,726 B2 | * | 7/2004 | Alden et al. | 343/703 |
| 7,119,739 B1 | * | 10/2006 | Struckman | 342/174 |
| 7,130,755 B2 | | 10/2006 | Lee et al. | |
| 7,222,033 B1 | | 5/2007 | Newson et al. | |
| 7,308,233 B2 | * | 12/2007 | Allen | 455/67.13 |
| 7,368,305 B2 | * | 5/2008 | van der Weide et al. | 438/20 |

(Continued)

FOREIGN PATENT DOCUMENTS

EP 0665447 10/2002

OTHER PUBLICATIONS

Emscan Corporation, EMI Scanning Solutions and Assessment Tools to Help You Solve EMC Design Problems in a Single Design Cycle, Calgary, Canada—Brochure.

*Primary Examiner*—Minh D Dao
(74) *Attorney, Agent, or Firm*—Bennett Jones LLP

(57) ABSTRACT

A near field microwave scanning system includes a switched array of antenna elements forming an array surface, a scan surface substantially parallel to the array surface and separated by a distance less than about 1 wavelength of the measured frequency, and a processing engine for obtaining and processing near field data, without the use of an absorber.

7 Claims, 8 Drawing Sheets

U.S. PATENT DOCUMENTS

| | | | |
|---|---|---|---|
| 2002/0140600 A1 * | 10/2002 | Utley et al. | 342/360 |
| 2003/0139662 A1 * | 7/2003 | Seidman | 600/407 |
| 2003/0231141 A1 | 12/2003 | Alden et al. | |

* cited by examiner

MULTICHANNEL ABSORBERLESS NEAR FIELD MEASUREMENT SYSTEM

CROSS REFERENCE TO RELATED APPLICATIONS

This application claims the priority benefit of U.S. provisional patent application No. 60/744,316 filed on Apr. 5, 2006 entitled "Mulitchannel Absorberless Near Field Measurement System", the contents of which are incorporated herein by reference.

FIELD OF THE INVENTION

The present invention is directed to the measurement and calibration of EIRP/ERP from multimode and/or multiband and/or multiple input/multiple output (MIMO) mobile or cellular phones, as well as being transparent to the measurement of transmit (Tx)/receive (Rx) performance, all without the need for a galvanic RF connection. In particular, the invention relates to the estimation of Effective Isotropic Radiated Power (EIRP) and Effective Radiated Power (ERP), radiation pattern, directivity and magnetic near field distribution from RF and microwave transmitters using the real time measurements from a near field scanning system at distances less than about one wavelength.

BACKGROUND

When cellular phones or mobile radio devices are manufactured, they must be calibrated to transmit a known RF power (galvanic power) from the transmitter to the antenna structure as well as to radiate known RF power (EIRP/ERP) from the antenna structure. The power calibration also must be performed at various levels throughout the operating range of the mobile device. This calibration ensures that the highest power transmitted to and from the antenna produces legal and acceptable specific absorption rate (SAR), which protects the health and safety of the user, and for a given EIRP/ERP limit. As well, the power calibration assists in maintaining a valid wireless link in cellular communications while minimizing power usage, thereby extending battery life, and maximizing coverage and capacity of the cell sector.

Conventionally, a sample of every cell phone model to be retail marketed is tested for the maximum EIRP/ERP Level in a test lab for several hours, with a considerably large measurement uncertainty of greater than 2.0 dB. Before performing this test, the galvanic power of the cell phone must be calibrated and the cell phone is set to radiate with maximum galvanic power.

The cell phone RF power is conventionally delivered to the cell phone test set using a physical hardwired connector just before the antenna section of the RF circuit, and is adjusted via a cable connection between the RF connector on the cell phone and test set. Once the maximum EIRP/ERP level is adjusted or found to meet regulatory limits for a given galvanic power, then only the SAR level measurements are performed for legal compliance.

To calibrate the RF power of a cell phone having more than one antenna, as well as for devices with MIMO architecture, the manufacturer usually provides a single RF connector along with an RF switch, filter and impedance matching for each antenna circuit. As the RF connector is well before the RF switch, filter and matching circuits, the performance of each of the antenna circuit is unknown even after successfully completing all the manufacturing tests of the cell phone using the conventional method.

While performing the SAR measurement, the maximum galvanic power level obtained in the first step is used as the starting level. If the galvanic power requires adjustment to meet the SAR limits, the adjusted galvanic power level will be considered the maximum power that can be fed to the antenna, and then EIRP/ERP levels must be re-evaluated.

All the manufactured cell phone samples of the same model are calibrated using the new galvanic power level as the maximum power to the antenna. Once this maximum level is calibrated, up to 20 intermediate power levels are set throughout the dynamic range. In order to perform these tests, a galvanic RF link is established using a cable between the cell phone RF connector and the test set. The RF connector of the cable for the cell phone connection end wears out over time and is replaced based on an estimated maximum number of insertions during the manufacturing test cycle for all produced units (usually very large). Production testing is stopped and a new cable must be introduced and a recalibrated before manufacturing testing can resume. This introduces delay and cost.

After each cell phone is calibrated for appropriate RF power levels (galvanic) in order to meet the legal EIRP/ERP as well as SAR levels, each cell phone is further tested for Tx and Rx performance. To perform this test, the cell phone is connected to the cell phone tester using an RF cable between its RF connector and test equipment as discussed above. In the majority of the cases, the RF power calibration is done in one location and the Tx/Rx parametric testing is done in another location. In the event these tests are performed at different locations, the RF cable connected between the cell phone and test set must be replaced frequently with a new RF cable due to the large number of insertions. A recalibration of the RF cable must be performed before continuing the manufacturing Tx/Rx parametric testing of cell phones which introduces further delay and cost.

During board level manufacturing or designer testing to optimize the RF parameters of cell phones, the measurements are performed with an RF galvanic connection. This method does not provide all the necessary measurements to understand the complete performance of the RF circuit.

During the design and development of new cell phone models, designers often go though a series of iterations to improve the radiated performance of the cell phone antenna model for achieving greater usable range while targeting low SAR levels and low galvanic RF power. Each time the radiated performance of the cell phone is measured, it is necessary to go to the test labs where EIRP/ERP levels can be optimized through a series of measurements. Currently no tool exists for finding accurate near field spatial distribution of the RF radiation in the near field to minimize unwanted radiation. Designers rely on the conventional testing methods in the test labs for far field radiated patterns and then debug at the circuit board level, which is a very tedious and complicated process.

For measuring antenna properties such as radiation pattern, gain, and directivity, near field scanners are employed to gather accurate amplitude and phase data and subsequently to calculate the equivalent far field value using one of many transformations known and available in the prior art. To accurately estimate the far field, those skilled in the art believe the measurement distance between the probe and antenna under test should be greater than or equal to one wavelength. Current near field testing is performed using a mechanical scanner with a single compensated probe which can detect both polarizations. These measurements usually take more than a few hours to complete a scan of the entire radiating surface.

When near field radiation is measured, the array elements and ground plane behind them have considerable effect on the near field distribution of the radiating source as well as its far field properties. In the prior art, using multi-axis near field measurement systems, the measurement is performed at greater than one wave length from the array surface in order to minimize the ground plane effect, which is then accounted for relatively easily. Alternatively, a perfect near field absorber such as that described in U.S. Pat. No. 6,762,726 B2, issued Jul. 13, 2004, is used to increase the isolation between the radiating and array surfaces thus decreasing the mutual coupling. In either case, the array sensitivity is significantly decreased.

Therefore, there is a need in the art for method and apparatus of measuring EIRP and ERP from RF and microwave transmitters, particularly with an application to MIMO mobile or cellular phone measurement and calibration of EIRP/ERP, as well as Tx/Rx performance. Such apparatus should preferably perform measurements in the near field, without the need for a physical galvanic RF connection, and without the need for an absorber.

SUMMARY OF THE INVENTION

The present invention comprises a novel multi-channel near field scanning system for measuring and calibrating EIRP/ERP of RF and microwave transmitters. Preferably the scanning system is transparent for the accurate and repeatable measurement of Tx/Rx performance. A radiating source such as a multimode and or multiband and or MIMO mobile or cellular phone is placed on a scanner of finite area at distances equal to or smaller than one wavelength of the operating frequency of the radiating source. Preferably, the distance is about 1/6 to about 1/34 of the wavelength. A multi-channel electromagnetic scan is performed in real time using an electronically switched array of probes and the near field amplitude and phase of both the x and y components of the radiating source are measured, corrected, re-measured and displayed. Using the corrected near field data, far field transformations and radiating source models, the EIRP/ERP, directivity and radiation pattern of the radiating source are estimated and displayed.

Due to its real time scanning speeds and accurate near and far field measurement capability, embodiments of the present invention may be used to debug the radiating sources, to improve RF circuits and to optimize antenna performance.

Embodiments of the present invention may also measure the Tx/Rx performance of a radiating source without the need for a galvanic RF connection. The transceiver, which may be a multimode and/or multiband and/or MIMO mobile or cellular phone, is placed on the scanner at distances smaller than one wavelength, preferably 1/6-1/34 of one wavelength, of the operating frequency of the radiating source. Two distinct and optimum RF channels of the near field scanner are selected and are assigned to Tx and Rx modes of the transceiver. Using an external test set, the Tx and Rx performance of transceiver is evaluated.

Therefore, in one aspect, the invention may comprise a near field microwave scanning system comprising:
(a) a switched array of antenna elements forming an array surface;
(b) a scan surface, wherein the scan surface is substantially parallel to the array surface and separated by a distance less than about one wavelength of the measured frequency;
(c) a processing engine operatively connected to the switched antenna array for obtaining and processing near field data, said processing engine comprising:
   i. a controller,
   ii. a channel selector and sampler,
   iii. a channel corrector,
   iv. a data translator and interpolator,
   v. an amplitude and phase detector,
   vi. a near field corrector,
   vii. a transformer for transforming the near field data to far field data, and
   viii. a user interface.

In another aspect, the invention may comprise a method of measuring and calibrating EIRP/ERP or Tx/Rx performance of RF and microwave transceiver, said method comprising the steps of:
(a) using a switched array of antenna elements forming an array surface;
(b) using a scan surface, wherein the scan surface is substantially parallel to the array surface and separated by a distance less than about one wavelength of the measured frequency;
(c) receiving output from each antenna;
(d) correcting the near field data;
(e) transforming the near field data to far field data; and
(f) without the use of an absorber.

BRIEF DESCRIPTION OF THE DRAWINGS

The invention will now be described by way of an exemplary embodiment with reference to the accompanying simplified, diagrammatic, not-to-scale drawings. In the drawings.

DETAILED DESCRIPTION OF PREFERRED EMBODIMENTS

The present invention provides for a method and apparatus for measuring radiated power of a radiating source in the near field. When describing the present invention, all terms not defined herein have their common art-recognized meanings. The term "about" when used in combination with a numerical value, shall mean the value includes a range of 10% above and below the value or within the known tolerances of the methods of measuring the value. The term "near field" means the field within a distance from the antenna equal to about one wavelength of the radio frequency being radiated. The references listed herein are incorporated herein as if reproduced in their entirety.

Figure 1:
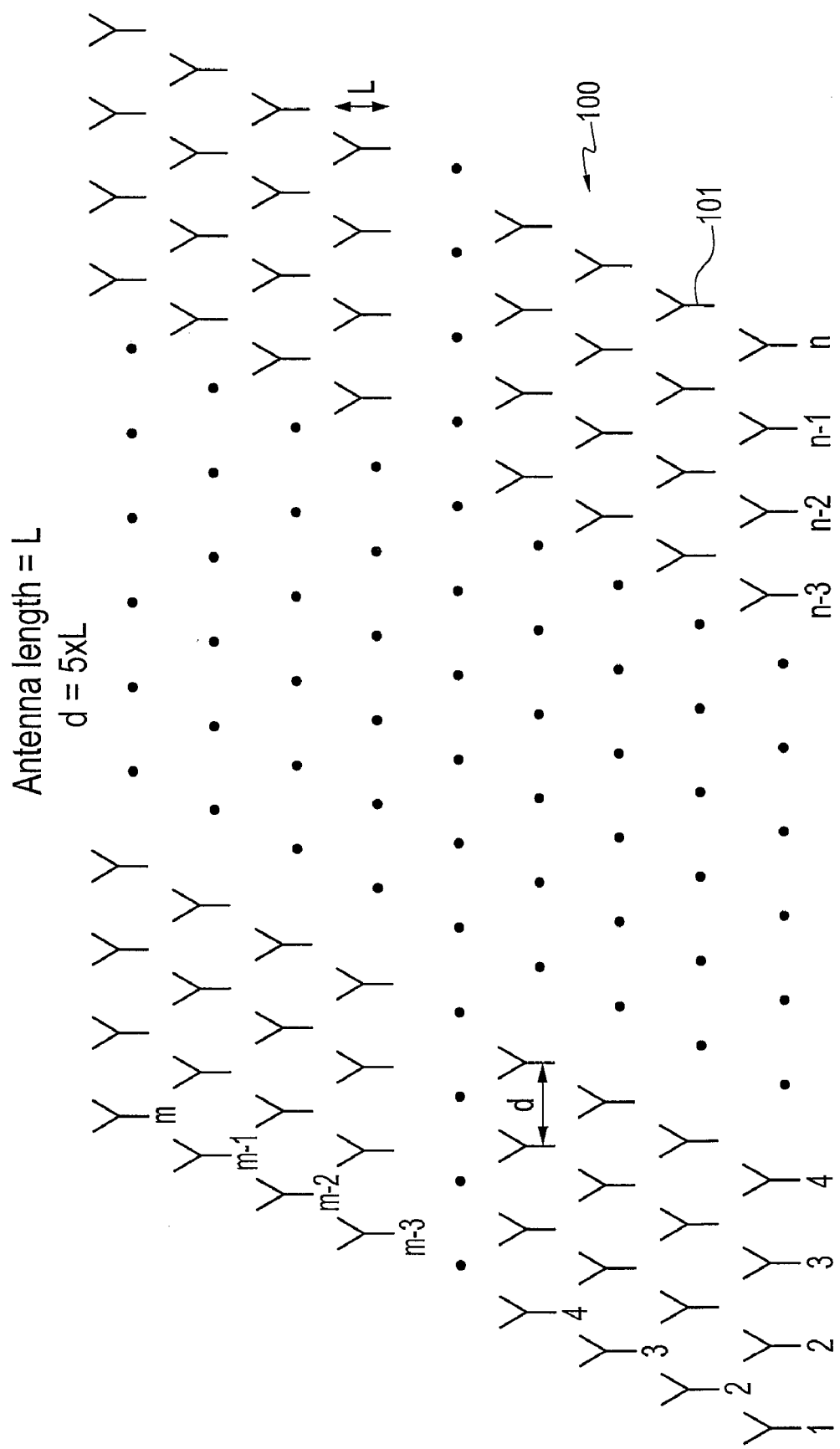
FIG. 1 is a schematic representation of the antenna array of a scanner.

The present invention comprises an absorber-less microwave near field scanner. In one embodiment, the scanner (100) includes a plurality of antennas (101) arrayed in a two-dimensional array capable of transmitting or receiving low level electromagnetic radiation. The antennas are preferably, but not necessarily, half loop antennas. As shown in FIG. 1, the array may have m elements in x-axis, and n elements in the y-axis. The loop dimensions length (L) and depth are optimized to provide sufficient discrimination between H-Field intensity and E-Field intensities. For a given scan area and radiated power accuracy, the inter element spacing (d) and the total number of array elements are determined. In one embodiment, m may be 24 while n may be 16, while d may equal about 10 mm. In one embodiment, d may equal about 5 L. A greater number of antennas within given area (smaller values of d) will provide greater accuracy, however, at a cost of increased mutual coupling effects between antenna.

Figure 2:
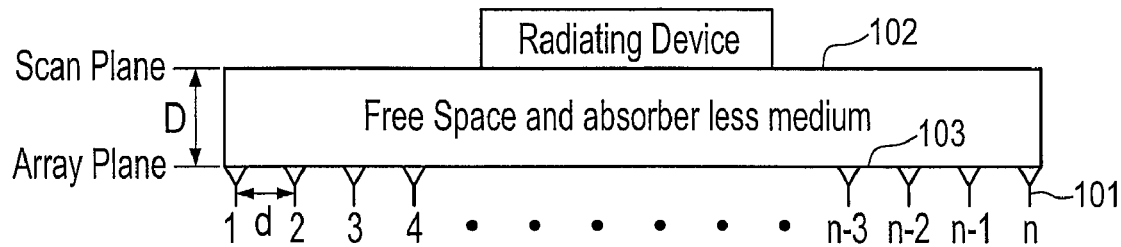
FIG. 2 is a side view of the antenna array and the scan plane.

As shown in FIG. 2A, the scan plane (102) is placed at a distance (D) from the array surface (103) with the preferred range of about $1/17^{th}$ to about $1/6^{th}$ of wavelength and the corresponding inter element distance (d) range of the array is preferably about $1/34$ to about $1/12^{th}$ of wavelength. If D is such that the scan plane is too close to the array surface, the array surface may be within the very reactive near field, as shown in the FIG. 6, with negative consequences. However, as D gets larger, the size of the array must be increased to obtain the same scan energy. In one embodiment, D/d may be about 2.0.

The embodiment illustrated shows a planar scan plane and antenna array, which are substantially parallel to each other. Alternative embodiments may include spherical, cylindrical or other geometrical scan surfaces.

Figure 3:
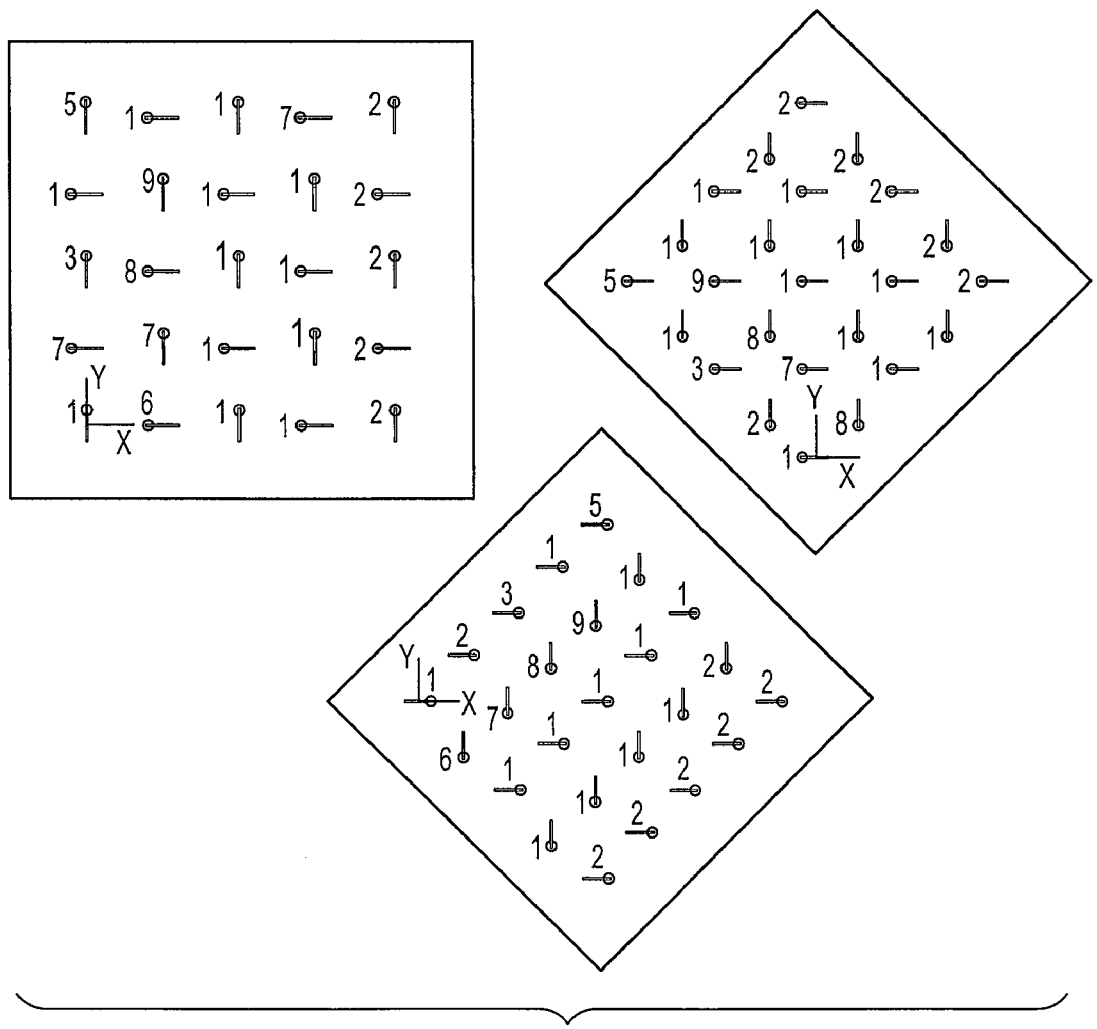
FIG. 3 shows alternative arrangements of a half-loop antenna array.

The typical layout of the half loops (101) is such that the successive array elements transmit or receive the orthogonal polarizations of H field intensity. Alternative layout arrangements can also be used with this scanner or array, including those arrangements shown in FIG. 3.

The outputs from the array antennas are fed through a backplane to the secondary side of a multilayer printed circuit board (PCB). The PCB layer stack and layout should preferably be able to provide an element-to-element isolation better than 20 dB over the frequency range of interest. The one end of the half loop antenna (101) is connected to a ground plane immediately adjacent the antenna layer, and other end of the half loop antenna is connected to a microstripline layer through a feed via with appropriate matching.

Figure 4:
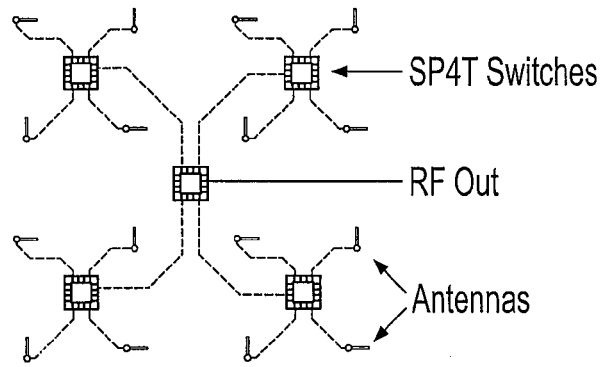
FIG. 4 shows a two-layer switch array.

The output from a specific antenna (101) is selected by means of switches (110) which can select the output from any one of the antenna elements (101). Because the large number of antenna elements makes a single switch for each antenna difficult to implement, one embodiment of the invention comprises a system of layered switches, which permits the use of a relatively small number of switches. In one example, using 3 layers of SP4T switches, the number of signals can be reduced by a factor of 64. Thus, a 384 element array can be reduced to 6 RF outputs. A module of 16 elements with two layers of switches is in FIG. 4.

Along with the switch matrix, a second channel is connected to one antenna element to provide a reference signal. This reference signal is necessary to make relative phase measurements. The architecture of antenna array is such that it is expandable to simultaneous radiated power measurement of more than one radiating surface or device by appropriately selecting a pair of channels.

A selected and a non-selected antenna should preferably be adequately isolated from each other. Poor isolation phenomena is typically due to leakage in the cavity formed by adjoining ground planes, such that the antenna feed vias extend conduction of the antenna currents though the inner layers to the component layer, making the feed via an effective radiator.

Measurement and simulation of antenna isolation in a two layer board showed very good isolation. As a result, we believe that the coupling was not due to the antenna structure and was not present with only one ground layer. When the simulation model was changed to include more than two ground layers, significant leakage was observed. Power would flow from one via to the next in the substrate between the ground layers with very little attenuation.

A coaxial feed may provide excellent isolation in theory, however, a coaxial feed may be difficult to manufacture. A more practical solution may be to implement with ground via or ground ties. Therefore, in one embodiment, the PCB includes isolation means consisting of a ground via (or a ground tie) connecting all the ground layers together. We have found that positioning the ground tie closer to the feed via produces better isolation, and using multiple ground ties also produces better isolation.

Figure 5A:
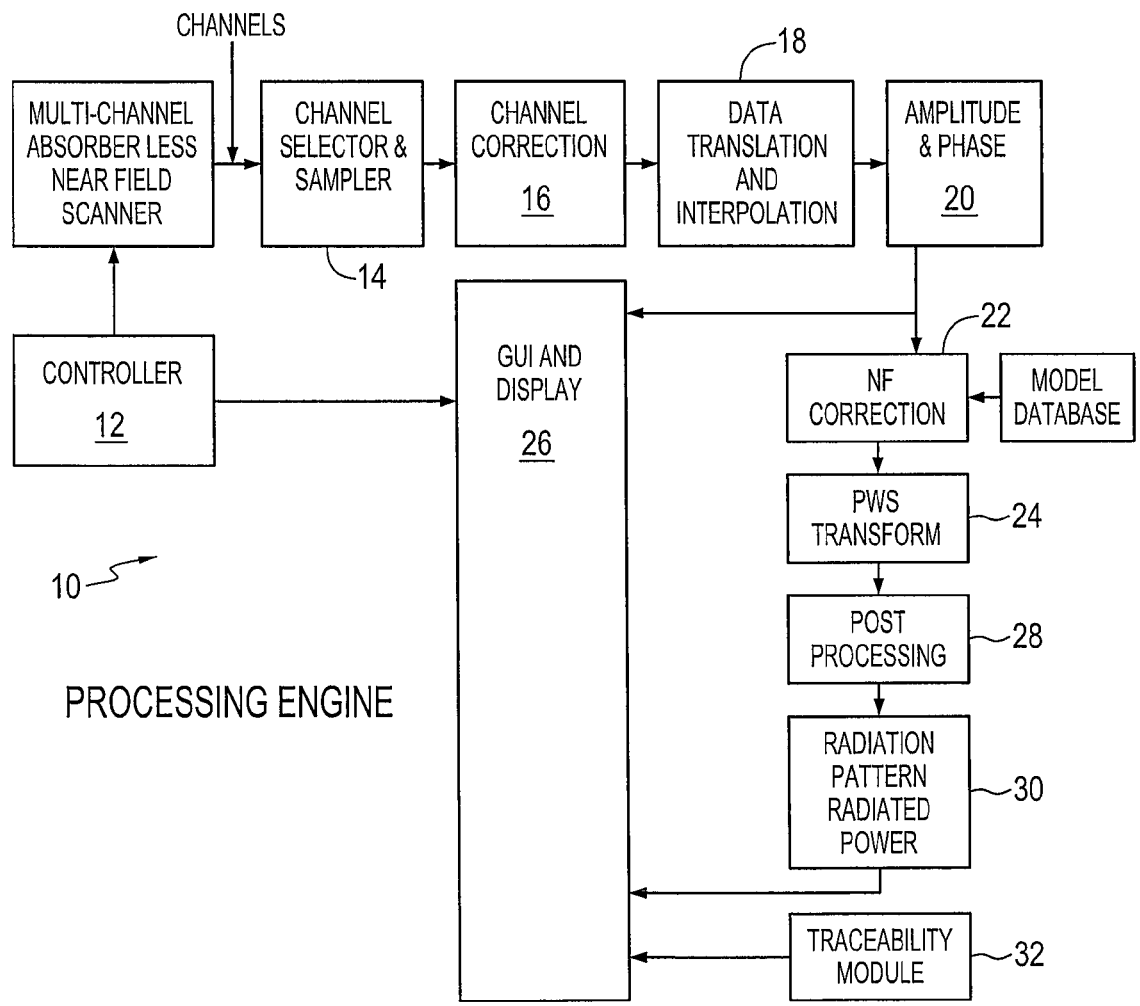
FIG. 5A shows a schematic depiction of the processing engine.

The processing engine accepts antenna signals from the scanner PCB and processes them to provide useful information. In one embodiment, as shown schematically in FIG. 5, the processing engine (10) comprises a controller (12), a channel selector and sampler (14), a channel corrector (16), a data translator and interpolator (18), an amplitude and phase detector (20), a near field corrector (22), a transformer for transforming the near field data to far field data (24), and a user interface including a graphics card or other means for driving a display (26). The processing engine may also include a post-processor (28) and means for determining EIRP (30). A traceability module (32) is optional.

The components of the processing engine may be implemented in software, firmware, hardware, or any combination thereof, as is well-known in the art.

Figure 5B:
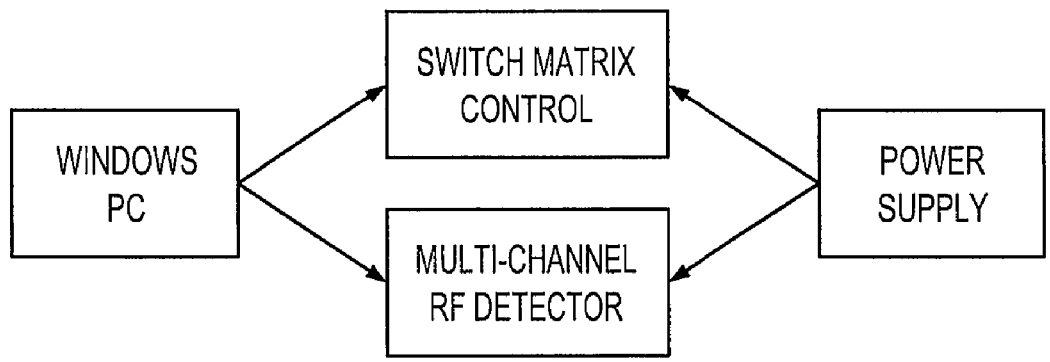
FIG. 5B shows a schematic representation of the controller function.
Figure 5C:
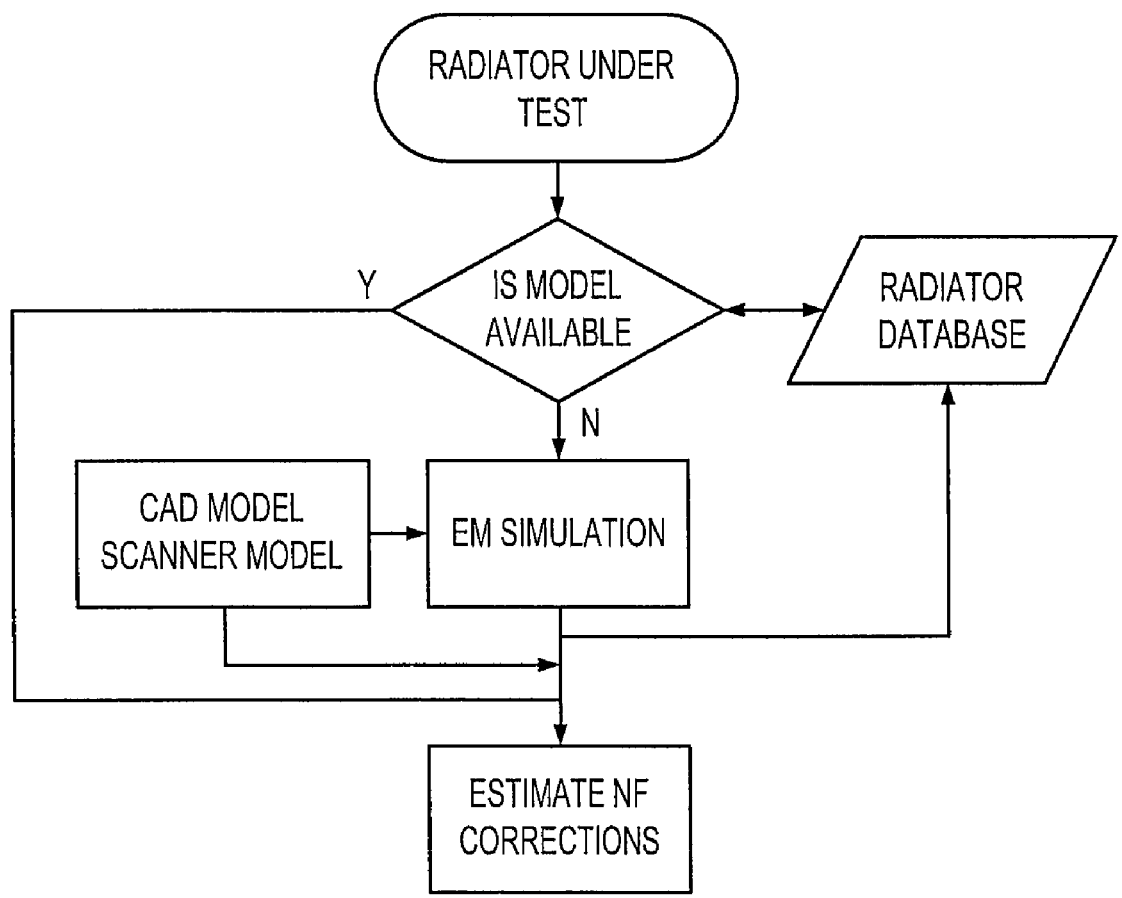
FIG. 5C shows a schematic flowchart depicting near field correction.

As shown in FIG. 5B the controller (12) functions primarily to supply power to the rest of the system and to control the switches and attenuators on the PCB. The controller (12) receives commands from the operating processor, which may be a desktop or laptop computer, and translates this data into the signals required to operate the antenna board and the signal conditioning section. The control board inputs are connected to the I/O on the computer. The input lines are used for data transfer of state control signals as well as routing signals, which will cause the proper state control to go to the proper output data lines.

To have complete control over the state of the antenna board and the signal conditioning system, two sets of inputs are required. One of the bits on the input is dedicated to the group select of the input. The feedback and delay section is necessary to handle the handshaking requirements of the I/O card. This section is also used to generate the CLK signal.

The ACK signal is sent from the I/O card and requires a REQ to be returned before the card will output the next set of data. The REQ signal must have a certain minimum delay and duration. This handshaking requirement is met by a simple feedback and delay circuit. The REQ delay is introduced by passing the ACK signal through two inverters implemented using NAND gates. A CLK signal is also introduced into the system using the two inverter approach.

Since the total output data lines required from the power and control board are many (38 lines in the embodiment shown), some form of de-multiplexing or decoding is needed and in this case both strategies are employed on the board. Suitable demultiplexing and decoding strategies are well-known to those skilled in the art.

The user interface and display (22) may display data on a conventional computer monitor, and accept user inputs via a computer keyboard, and mouse, as is well known in the art. In one embodiment, the user interface is a graphical user interface (GUI) and the display architecture is designed to provide flexibility to feed test parameters such as selection of the scan area, reference probes, scan type, selection of models, frequency range and loading the data such as raw data, DAQ corrected data, probe corrected data, translated data, path corrected data and reference far field data. Once all test parameters are loaded, the GUI and display section (22) of the processing engine (10) interprets the loaded test parameters and create a test sequence and starts executing each test sequence with the help of the controller while simultaneously measuring/logging the scan data to a computer memory. Additionally or optionally, the scan data may be written to a hard drive or other data storage device for further processing.

The scan data is then further processed to determine the 2D and 3D component specific near field distribution, total near field distribution, amplitude and phase distribution, far field pattern in principle cuts and for any desired cuts, ERP, EIRP and directivity in real time.

In a two channel system, the channels are designated as reference and measurement channels respectively. In one embodiment, the reference channel is connected to an unique element of the array, however, it can also be reconfigured to connect to different elements of the array which may be determined dynamically by the controller, based on the scanned information or input parameters. The system architecture enables to select a pair of antenna elements of the array and connects them to reference and measurement channels simultaneously.

Both the reference and measurement input channels are mixed down to an intermediate frequency (IF). The IF signals are further amplified and processed through band pass filters. These filters will determine the frequency range of the IF, so in order to cover the full measurement frequency range, the local oscillator (LO) will need to be programmed to generate the correct IF range. The full input frequency range will be broken down into N segments equal in width to the IF filter bandwidth. Preferably, the LO would be designed to only cover the frequency regions of interest, that is the cellular bands. For the reference channel, the log amplifier will determine the peak or averaged peak amplitude. The limiter output from the log amplifier will be passed through a comparator and into a counter that will determine the signal frequency. On the measurement channel, an additional switchable attenuator will be used after the amplifier in order to increase the range of the allowable input signal strength. An RMS detector will measure the amplitude of the measurement channel. Optionally, the same detector could also be used to determine the peak amplitude. Using both detectors, it is possible to detect and measure the signal strength of the received modulated RF energy with various modulation formats.

For the phase measurement, two phase detectors are used. One will input the reference and measurement channels directly from the IF filters, while the other will have a 90 degree phase delay filter on the reference channel.

A microprocessor will control and read the measurements from the associated A/D converters and the counter. It will communicate with the processing system to determine the input frequency band and other necessary information, and it will transmit the signal measurements to the processing system. To achieve the required precision, the A/D converters should preferably have a minimum of 10 bits of resolution. The sample rate should preferably be at least 1 MSPS, although having a faster sample rate will likely reduce the required time to make all required measurements and allow for some averaging of the data as well.

The amplitude and phase measured by the RF sampler is in a raw state to which various corrections are applied to create an accurate data set of the scan plane. Initially, the RF sampler amplitude and phase correction is applied at a given frequency and for a given temperature. Subsequently, path loss correction is applied to both amplitude and phase at a given frequency and for a given temperature. Lastly, the corrected amplitude and phase data is converted to field quantities applying antenna factor correction.

As each element of the antenna array measures only one magnetic field component orthogonal to that of its adjacent one, interpolation is applied in order to get both transverse components at each sampling point of the scan plane. For amplitude, interpolation is implemented by averaging its four adjacent measured points. For edge elements, data is interpolated from its adjacent three elements. For corner elements, data is interpolated from its adjacent two elements. In one embodiment, phase interpolation may be achieved by a three points method. First, the 4 adjacent data points are sorted from minimum to maximum. If the phase difference between the sorted adjacent data points is larger, the most unique one is discarded and the remaining three points are averaged. Otherwise, the four adjacent measured points are averaged. Preferably, special treatments for edge points and 4 corners may be used in order to get better results. Alternatively, extrapolation from internal points is adopted for those points.

In the amplitude and phase module (20), after the raw data is passed through the correction and interpolation stages, the amplitude and phase of the near field data is available for further processing display and storage.

The ground plane effect may be accounted for using methods described herein. Computations are performed to compute various models and their NF corrections. Far-field radiation pattern and radiated power of the antennas can be measured and studied by measuring near-field radiation [Johnson J. H. Wang, "An Examination of the Theory and Practices of Near-field Measurements," *IEEE Trans. Antennas Propagat.*, Vol. 36 pp. 746-753, January 1986].

Figure 6:
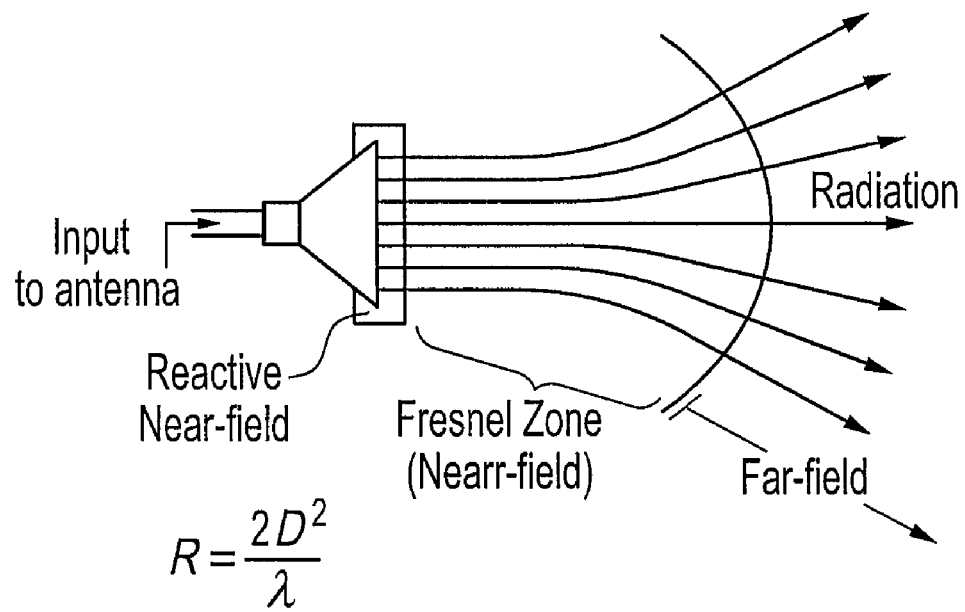
FIG. 6 shows a schematic depiction of the exterior fields of a radiating antenna.

FIG. 6 depicts the exterior fields of a radiating antenna, which are commonly divided into three regions: reactive near-field region, radiating near-field region and far-field region. The reactive near-field is excited in a small volume, just beyond the antenna and accounts for the stored electric and magnetic energies around the antenna and attenuates very rapidly. The reactive near-field region is commonly taken to extend about $\lambda/2\pi$ from the surface of the antenna, although conventional near-field measurements use a distance of a wavelength (A) or greater to minimize the system uncertainty [Arthur D. Yaghjian, "An Overview of Near-field Antenna Measurements," *IEEE Trans. Antennas Propagat.*, Vol. AP-34 pp. 30-45, January 1986.]

Conventional scanning techniques of near-field measurement of antennas are based on the plane-wave spectrum (PWS) representation of fields that can be found in the early works of Whittaker and Watson [G. T. Whittaker and G. N. Watson, *Modern Analysis*, $4^{th}$ ed. London: Cambridge Univ. Press, 1927, ch. XVIII].

Figure 7:
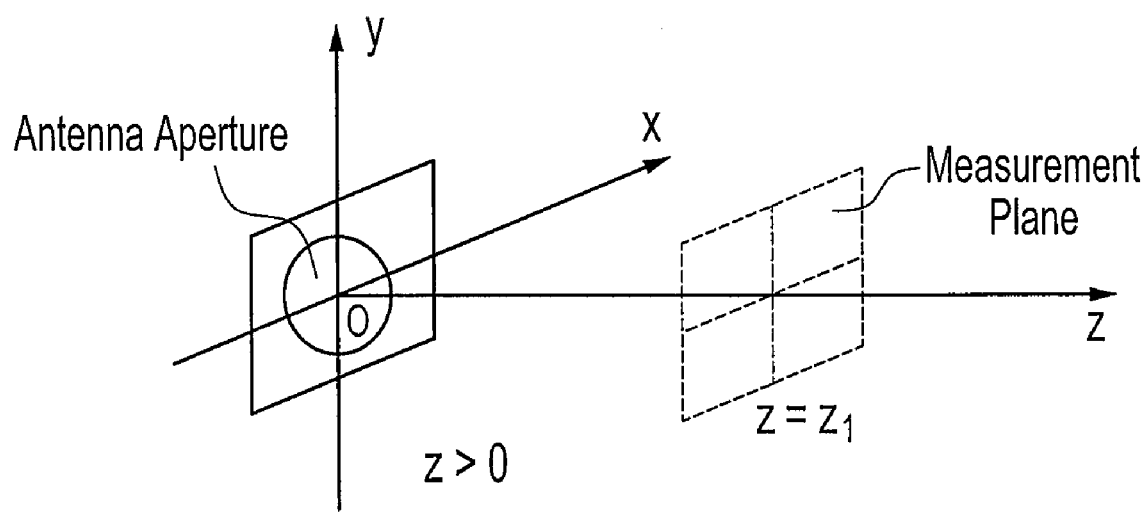
FIG. 7 shows a schematic depiction of the geometry of a planar near field measurement.

A planar near-field measurement system is depicted in FIG. 7. The aperture of the radiating antenna is in x-y plane of $z \leq 0$. The plane for near-field measurement is in x-y plane of $z=z_t$. Considering that the region of $z>0$ is source-free, the solutions to the time-harmonic electromagnetic field in front of the antenna aperture can be expressed as $$E(x, y, z) = \frac{1}{2\pi} \int_{-\infty}^{+\infty} \int_{-\infty}^{+\infty} A(k_x, k_y) e^{-jk \cdot r} dk_x dk_y \quad (1)$$

$$H(x, y, z) = \frac{1}{2\pi} \int_{-\infty}^{+\infty} \int_{-\infty}^{+\infty} k \times A(k_x, k_y) e^{-jk \cdot r} dk_x dk_y \quad (2)$$

with $k_x A_x(k_x, k_y) + k_y A_y(k_x, k_y) + k_z A_z(k_x, k_y) = 0 \quad (3)$ where $k_x$ and $k_y$ are real variables and $k = k_x \hat{a}_x + k_y \hat{a}_y + k_z \hat{a}_z$ (4)

k may be called as wave number vector and $A(k_x, k_y)$ is called as the plane wave spectrum because the expression $A(k_x, k_y)e^{-jk\cdot r}$ in the integrants represents a uniform plane wave propagating in the direction k.

The equations are transformed and rearranged to express PWS $A(k_x, k_y)$ from Near-field using component $H(x, y, z)$ $$k_y A_z(k_x, k_y) - k_z A_y(k_x, k_y) = \quad (5)$$
$$e^{jk_z z_i} \frac{1}{2\pi} \int_{-\infty}^{+\infty} \int_{-\infty}^{+\infty} H_x(x, y, z_t) e^{j(k_x x + k_y y)} dx dy$$

$$k_z A_x(k_x, k_y) - k_x A_z(k_x, k_y) = \quad (6)$$
$$e^{jk_z z_i} \frac{1}{2\pi} \int_{-\infty}^{+\infty} \int_{-\infty}^{+\infty} H_y(x, y, z_t) e^{j(k_x x + k_y y)} dx dy$$

In the far-field zone of the antenna (k z≫1), based on the method of steepest descent, it can be shown that equation (1) can be represented by the asymptotic expansion [P. C. Clemmow, The Plane Wave Spectrum Representation of Electromagnetic Fields. London: Pergamon, 1966]

$$E(x, y, z) = \frac{je^{-jkr}}{r} k_z A(k_x, k_y) \quad (7)$$

When planar near field scanning is performed on a radiating surface, due to the practical reasons and limitations, the scan has to be limited to a finite area in the x-y plane. Plane wave spectrum transformation may be applied on this scanned data to determine the far field properties of the radiating surface. The accuracy of the far field transformed data at a given frequency is limited by the finite area used for scanning. The data may be further processed in a post-processing module to improve the accuracy.

Conventional radiated power measurements are performed either in free space or in presence of huge ground plane. The far field data estimated using PWS provides estimates in free space. The data set is corrected to account for the ground plane interactions, as necessary.

Calculations of Power Density Pattern or Radiation Pattern, Directive Gain, Radiated Power and EIRP may be performed as follows:

$$U(\theta, \phi) = S(\theta, \phi) R^2$$
$$= \frac{1}{2} \text{Re}(\vec{E} \times \vec{H}^*) \cdot \hat{r} R^2$$
$$= \frac{|E|^2 R^2}{2Z}$$
$$= \frac{Z^2 |H|^2 R^2}{2Z}$$
$$= \frac{Z^2 k^2}{2Z} \left[ \begin{array}{c} (1-a_y)^2 |M_x|^2 + (1-a_x)^2 |M_y|^2 + \\ 2 a_x a_y [\text{Re}(M_x) \text{Re}(M_y) + \text{Im}(M_x) \text{Im}(M_y)] \end{array} \right]$$

The $Z^2$ is taken out as $P_{offset}$, which will also takes other coefficient into account. In Matlab, PDS→U. Radiated power is obtained by integrating power density over the hemisphere. The hemisphere is divided into 50×100 pieces. And again, integration is carried out by summing the power density over the hemisphere.

For one complete scanning, the value can be obtained. If the scan is continued one after other, the quasi real time curve can be provided.

$$P_{rad} = \int_0^{2\pi} \int_0^{0.5\pi} U(\theta, \phi) \sin\theta \cdot d\theta d\phi$$

In the current implementation, $d\theta=1.8°$, $d\phi=3.6°$.

The power gain of an antenna in the direction specified by the spherical co-ordinates $(\theta, \phi)$ is defined as:

$$G_p(\theta, \varphi) = 4\pi \frac{U(\theta, \varphi)}{P_{in}}, \quad (30)$$

where $U(\theta, \phi)$, radiation intensity, is defined as "the power radiated from an antenna per unit solid angle" [C. A. Balanis, "Antenna Theory: Analysis and Design", Second Edition, John Wiley & Sons, 1997] in the direction $(\theta, \phi)$, and $P_{in}$ is the total power accepted by the antenna from the source. $P_{in}$ is computed from the voltage and current at the source as:

$$P_{in} = \frac{1}{2} \text{Re}(VI^*) \quad (31)$$

and $$U(\theta, \varphi) = \frac{1}{2} R^2 \text{Re}(E \times H^*) = \frac{|E|^2 R^2}{2\eta} \quad (32)$$

E is obtained from equation (28) with r in the direction $(\theta, \phi)$, and r=R Directivity is similarly defined as:

$$D = 4\pi \frac{U(\theta, \varphi)}{P_{rad}}$$

where $P_{rad}$ is the total power radiated by the antenna, $$P_{rad} = P_{in} - P_{loss}$$
$$= \oiint_\Omega U d\Omega$$
$$= \int_0^{2\pi} \int_0^\pi U \sin\theta d\theta d\varphi$$

and $P_{loss}$ is the total ohmic loss in the antenna.

If the direction is not specified, it implies the direction of maximum radiation intensity (maximum directivity) express as $$D_{max} = \frac{U_{max}}{U_0} = 4\pi \frac{U_{max}}{P_{rad}}$$

The Effective Isotropic Radiated Power (EIRP) is the apparent power transmitted towards the receiver, if it is assumed that the signal is radiated equally in all directions, i.e. as a spherical wave emanating from a point source. This power is given by:

$$EIRP = G_t \cdot P_t$$
$$= D \cdot P_{\text{rad}}$$

where:
Gt=gain of transmitter antenna,
Pt=power transmitted

EXAMPLES

The following examples are illustrative of the claimed invention, but not limiting thereof.

The typical accuracies realizable in the industry for gain and directivity using far field measurement techniques is of the order of +/−0.25 dB over the cell phone operating frequency ranges. To achieve the traceability, extensive electromagnetic numerical simulation were performed to realize similar far field accuracies by realizing and adjusting the numerical model parameters of the reference sources at the pre defined cell phone band frequencies. Using these simulations, the EIRP of the reference sources was found to be 29.66 dBm and 24.95 dBm with an accuracy of +/−0.3 dB at 1880 MHz and 836.4 MHz respectively. The near field amplitude and phase accuracies at very close distances were estimated from the near field data set derived from the far field simulations and found to be of the order of 0.30 dB and +/−5 degrees. Using the amplitude and phase data from the simulations a frequency and model sensitive NF correction factor was developed to calibrate the scanner system to +/−0.3 dB amplitude and +/−5 degree phase accuracies.

Figure 8A:
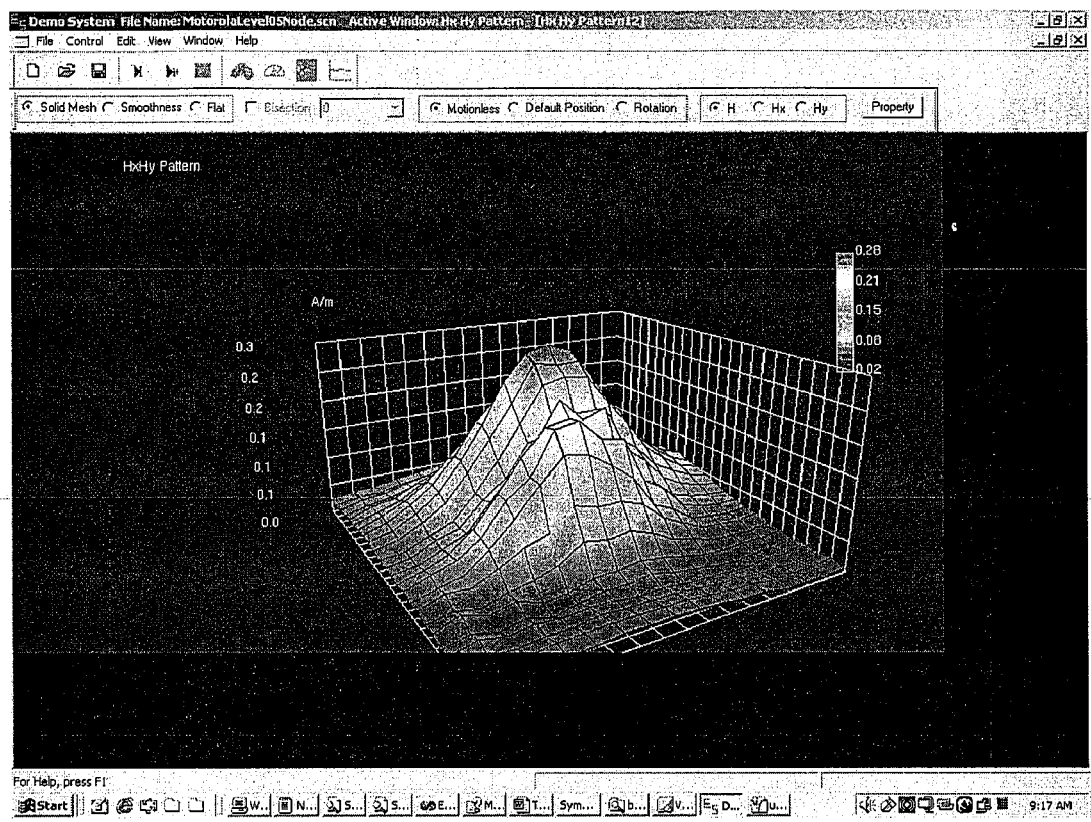
FIGS. 8A-8E show different screenshots of various displays produced by the graphical user interface of the processing engine.

FIG. 8A shows 3D near field total amplitude distribution of the radiating device under test. It is the resultant amplitude of the x and y magnetic filed intensities of the radiating device measured by each probe positioned at a predefined physical location.

Figure 8B:
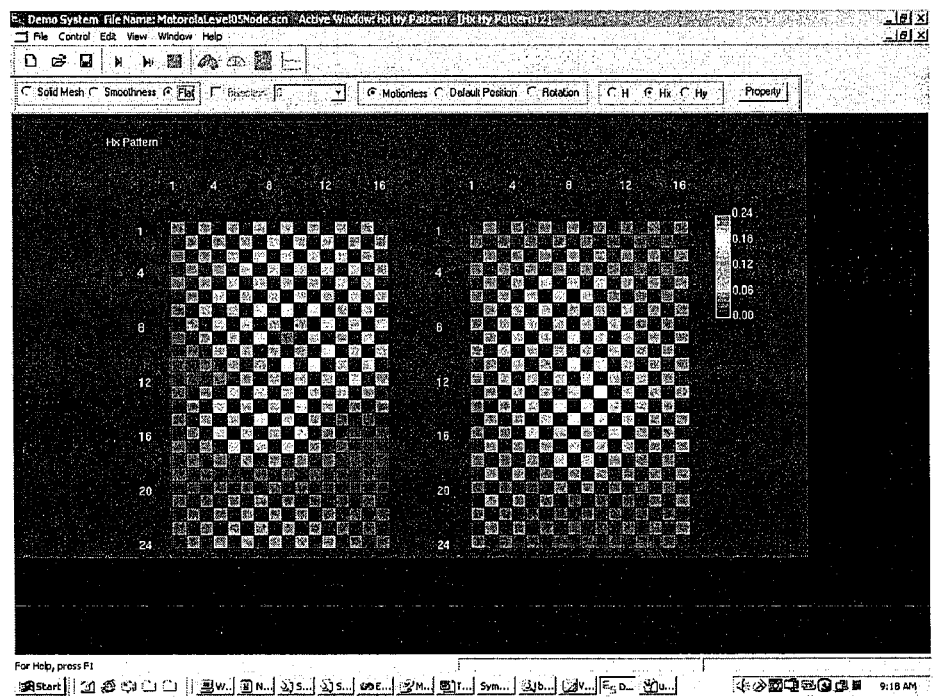

FIG. 8B shows 2D near field amplitude distribution of x and y components of the radiating device under test. It is the amplitude of the x and y components of magnetic filed intensities of the radiating device measured by each probe positioned at a predefined physical location.

Figure 8C:
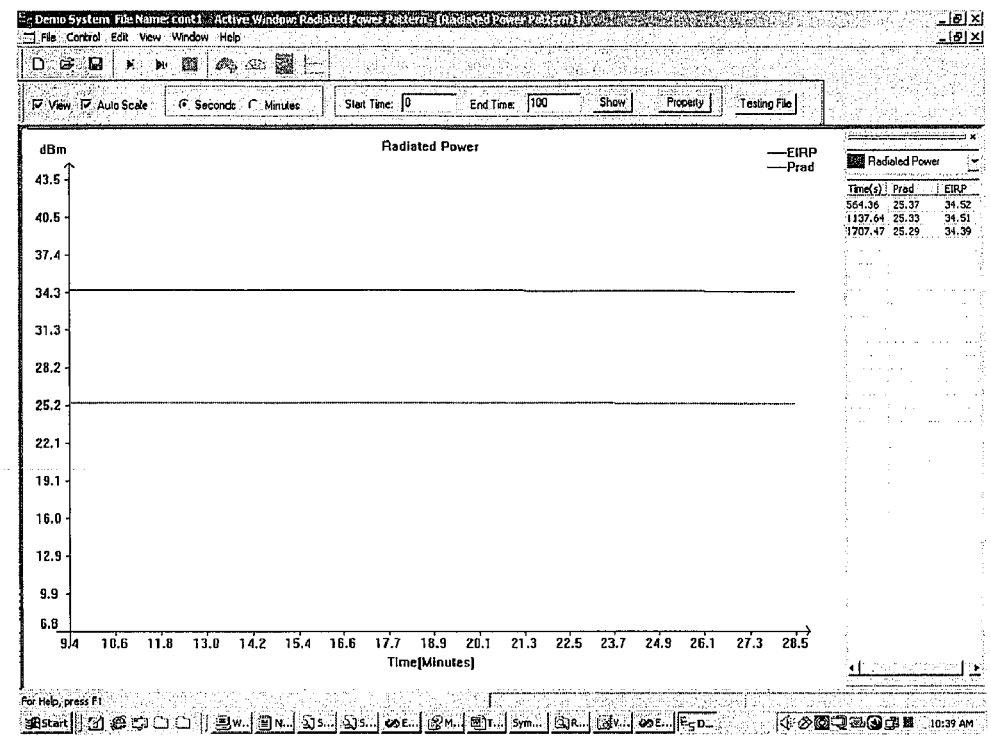

FIG. 8C shows the estimated value of EIRP, Directivity and Radiated Power (real time display) of the radiating device. The Radiated power is computed from the corrected near field amplitude and phase distribution as well as applying appropriate near field to far field transformations. The directivity and EIRP are computed further from the radiated power and computed radiation pattern of the radiating device.

Figure 8D:
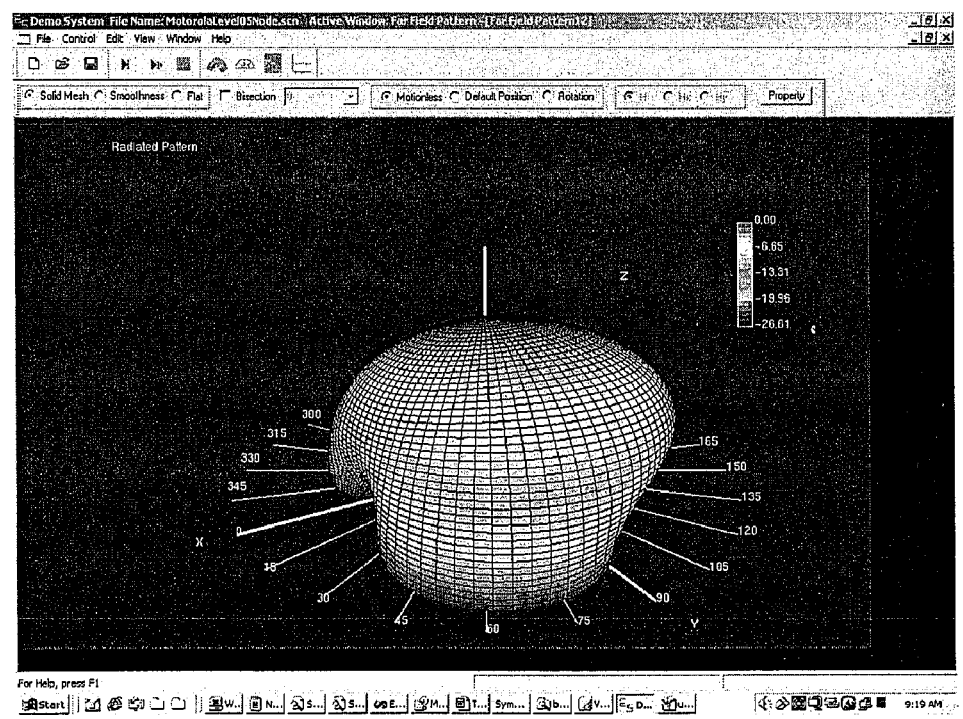

FIG. 8D shows 3D Hemispherical Radiation Pattern of the radiating device and is computed after applying the near field to far field transformations to corrected near field amplitude and phase distributions.

Figure 8E:
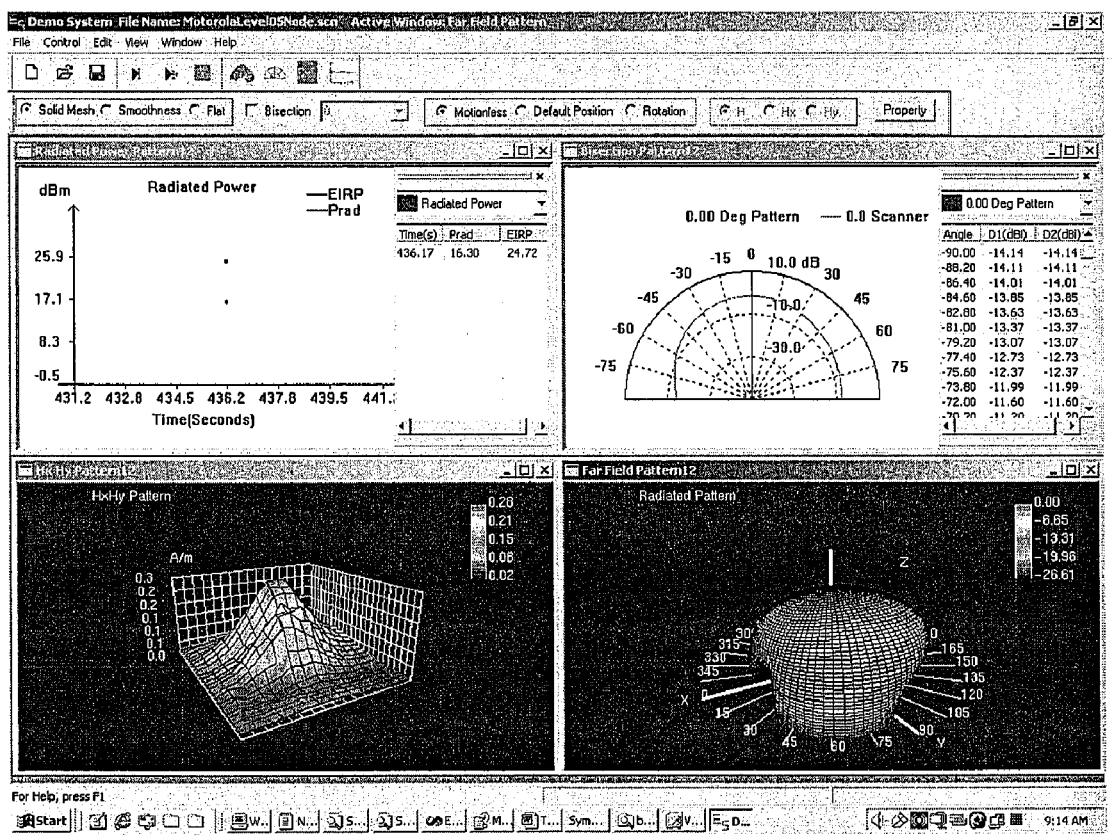

FIG. 8E shows an integrated GUI combining FIGS. 8A, 8B, 8C and 8D. Any on of these figures can be enlarged to show clearly the parameters that are being displayed. The displays showed in FIGS. 8A and 8B can be interchangeable by selecting appropriate options in the menu bar. The top right quadrant displays polar representation of the radiation pattern where the standard pattern of the device under test obtained from any test laboratory can also be super imposed on the computed radiation pattern of the scanner system.

As will be apparent to those skilled in the art, various modifications, adaptations and variations of the foregoing specific disclosure can be made without departing from the scope of the invention claimed herein. The various features and elements of the described invention may be combined in a manner different from the combinations described or claimed herein, without departing from the scope of the invention.

What is claimed is:

1. A near field microwave scanning system comprising:
   (a) a switched array of antenna elements forming an array surface;
   (b) a scan surface, wherein the scan surface is substantially parallel to the array surface and separated by a distance less than about 1 wavelength of the measured frequency;
   (c) a processing engine operatively connected to the switched antenna array for obtaining and processing near field data, said processing engine comprising:
      i. a controller,
      ii. a channel selector and sampler,
      iii. a channel corrector,
      iv. a data translator and interpolator,
      v. an amplitude and phase detector,
      vi. a near field corrector,
      vii. a transformer for transforming the near field data to far field data, and
      viii. a user interface.

2. The system of claim 1 wherein the scanning system operates without an absorber.

3. The system of claim 1 wherein the antenna elements are comprised in a multi-layer structure, and the antenna are isolated by means of feed vias through the multi-layer structure.

4. The system of claim 1 wherein the distance between the scan surface and the array surface (D) is between about $1/17^{th}$ to about $1/6^{th}$ of wavelength.

5. The system of claim 1 wherein the inter element distance (d) range of the array is between about $1/34^{th}$ to about $1/12^{th}$ of the wavelength.

6. The system of claim 4 or 5 wherein D/d is about 2.0.

7. A method of measuring and calibrating EIRP/ERP or Tx/Rx performance of RF and microwave transceivers, said method comprising the steps of:
   (a) using a switched array of antenna elements forming an array surface;
   (b) using a scan surface, wherein the scan surface is substantially parallel to the array surface and separated by a distance less than about 1 wavelength of the measured frequency;
   (c) receiving output from each antenna;
   (d) correcting the near field data;
   (e) transforming the near field data to far field data; and
   (f) without the use of an absorber.

* * * * *